United States Patent [19]

Arima et al.

[11] Patent Number: 4,465,529
[45] Date of Patent: Aug. 14, 1984

[54] METHOD OF PRODUCING SEMICONDUCTOR DEVICE

[75] Inventors: Hideaki Arima; Tadashi Nishimura; Masahiro Yoneda; Takaaki Fukumoto; Yoshihiro Hirata, all of Hyogo, Japan

[73] Assignee: Mitsubishi Denki Kabushiki Kaisha, Tokyo, Japan

[21] Appl. No.: 385,137

[22] Filed: Jun. 4, 1982

[30] Foreign Application Priority Data

Jun. 5, 1981 [JP] Japan .................................. 56-87799
Jun. 5, 1981 [JP] Japan .................................. 56-87800

[51] Int. Cl.³ .......................................... H01L 21/225
[52] U.S. Cl. .................................... 148/188; 148/189; 427/39; 427/85; 427/88; 204/164
[58] Field of Search ................. 148/188, 1.5, 189; 427/39, 85, 88; 204/164

[56] References Cited

U.S. PATENT DOCUMENTS

| 3,576,685 | 4/1971 | Swann et al. | 148/188 X |
| 3,718,502 | 2/1973 | Gibbons | 148/1.5 X |
| 4,340,617 | 7/1982 | Deutsch et al. | 148/188 X |
| 4,342,631 | 8/1982 | White et al. | 427/39 X |
| 4,351,674 | 9/1982 | Yoshida et al. | 29/571 X |
| 4,364,778 | 12/1982 | Leamy et al. | 148/186 X |

FOREIGN PATENT DOCUMENTS 56-8816  1/1981  Japan .................................. 148/1.5

Primary Examiner—G. Ozaki
Attorney, Agent, or Firm—Sughrue, Mion, Zinn, Macpeak and Seas

[57] ABSTRACT

A method for producing an impurity containing semiconductor substrate includes depositing an impurity on selected portions of the substrate by placing a charge on the substrate and converting a gaseous impurity containing atmosphere into a plasma. The impurity may then be diffused into the substrate to a controlled and shallow depth by employing a laser or the like to selectively irradiate the impurity.

9 Claims, 2 Drawing Figures

METHOD OF PRODUCING SEMICONDUCTOR DEVICE

BACKGROUND OF THE INVENTION

The present invention relates to a method for producing a semiconductor device, and more specifically to a method of forming a conductive layer having a different conductivity from that of the semiconductor substrate or having a different conductive type, on a surface region of the semiconductor substrate at a very small depth.

For such a purpose, ion implantation is conventionally used. In this method, a desired impurity is ionized and implanted into the semiconductor body under an acceleration of 5–100 keV. Although ion implantation is advantageous in treatments at normal temperatures, a heat treatment process at a very high temperature is required to restore defects produced during ion implantation, and it is difficult to obtain a conductive layer at a shallow depth because the impurities are diffused due to the heat treatment process.

SUMMARY OF THE INVENTION

The object of the present invention is to eliminate such disadvantages of the prior art and provide a method by which a conductive layer with the desired shallow depth may be obtained at very low temperatures.

The method according to the present invention is characterized in that the semiconductor substrate is at least partially exposed, and is disposed in a gas plasma of the desired impurity. A local potential drop or rise is applied to the semiconductor substrate whereby an impurity layer of high concentration is formed on the exposed portion of the semiconductor substrate. After forming the impurity layer on the exposed portion of the semiconductor layer, or simultaneously with the impurity layer formation, the substrate is subjected to a heat treatment whereby the impurity is diffused into the substrate and the conductive layer is obtained.

DETAILED DESCRIPTION OF THE PREFERRED EMBODIMENTS

Figure 1:
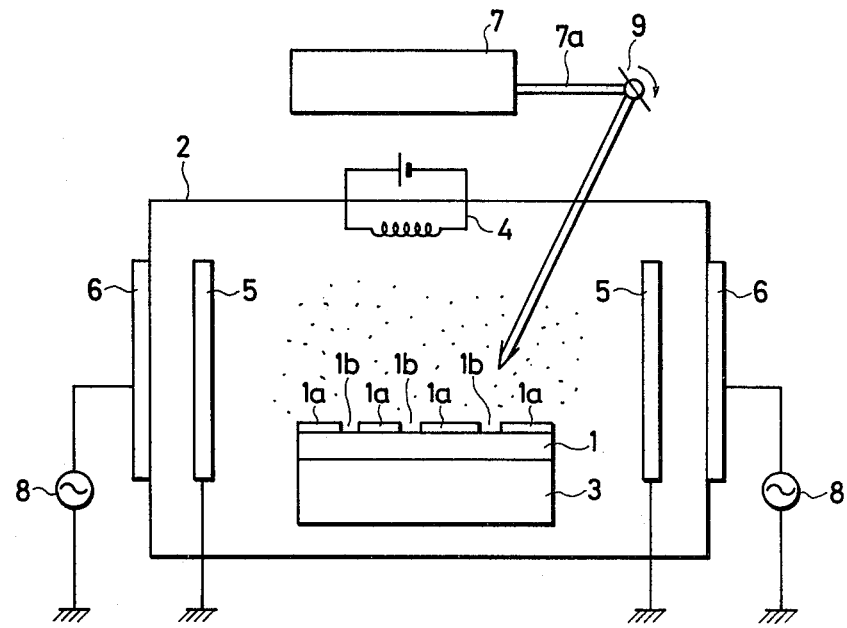
FIg. 1 is a schematic sectional view of an apparatus according to one embodiment of the present invention.

FIG. 1 is a schematic illustration of an apparatus for producing a semiconductor device. In the figure, a monocrystalline semiconductor substrate 1 includes an insulation layer 1a adhered to the surface thereof and forming apertures 1b. A sealed vessel 2 is internally evacuated, and an impurity which will specify the conductivity of the monocrystalline silicon substrate 1, including at least one of phosphorus, arsenic, boron or antimony is included as a constituent of the atmospheric gas which is introduced into the sealed vessel 2. A support body 3 is arranged within the sealed vessel 2 and supports the monocrystalline silicon substrate 1. The support body 3 can be heated to about 500° C. and its potential may be controlled from the outside of the sealed vessel 2. A filament 4 mounted on the sealed vessel 2 acts to generate electrons and to charge the monocrystalline silicon substrate 1 to a negative polarity whereby the substrate 1 is in the self potential formation state. High-frequency electrodes 5, 6 convert the atmospheric gas introduced within the sealed vessel 2 into a plasma state. One electrode 5 is arranged within the sealed vessel 2 and grounded, and the other electrode 6 is opposed to the electrode 5 and is connected to a high-frequency source 8 of a low voltage in the neighborhood of 100 V. Particle beam generating means 7 generates an energy beam 7a such as a laser or electron beam, which irradiates a a prescribed portion of the monocrystalline silicon substrate 1 under the control of a control means 9 such as a mirror.

In order to produce a semiconductor device using the apparatus constituted above, the monocrystalline silicon substrate 1 having exposed portions 1b is supported by the support body 3, and the interior of the vessel 2 is charged with an atmospheric gas which contains the impurity which will specify the conductivity of the monocrystalline silicon substrate 1. The high-frequency source 8 is energized and the atmospheric gas existing between the electrodes 5 and 6 is turned into plasma. At the same time, the filament 4 acts to generate electrons and to charge the monocrystalline silicon substrate 1 to a negative polarity. Then, the impurities in the plasma state produced between the high-frequency electrodes 5 and 6 are diffused towards the center portion of the sealed vessel 2, and in eliminating the charged state of the monocrystalline silicon substrate 1, are deposited on and adhere to the exposed portions 1b of the substrate 1.

After the deposition and adhesion of the impurity to the portions 1b of the semiconductor silicon substrate 1, or simultaneously with the deposition and adhesion, the beam generating means 7 is operated and an energy beam 7a controlled by the control means 9 irradiates a desired surface of the substrate 1. The impurity deposited and adhered to the surface of the monocrystalline silicon substrate 1 is reacted and diffused by the irradiation with the energy beam 7a, whereby an impurity conductive layer having a very small depth and a high concentration is formed within the substrate 1. Operation of the control means 9 changes the position of the beam 7a, whereby the impurity conductive layer may be formed at any desired position of the monocrystalline silicon substrate 1.

When a semiconductor device produced in such manner is inspected, no defects are found in the impurity conductive layer within the monocrystalline silicon substrate 1 formed by the high-concentration impurity layer adhered to the substrate. Therefore no heat treatment for remedying such defects is required, diffusion can be effected at a low temperature, and the formation of a junction at a small depth is very easily performed. As a secondary effect, the fineness of the device structure may be improved.

Figure 2:
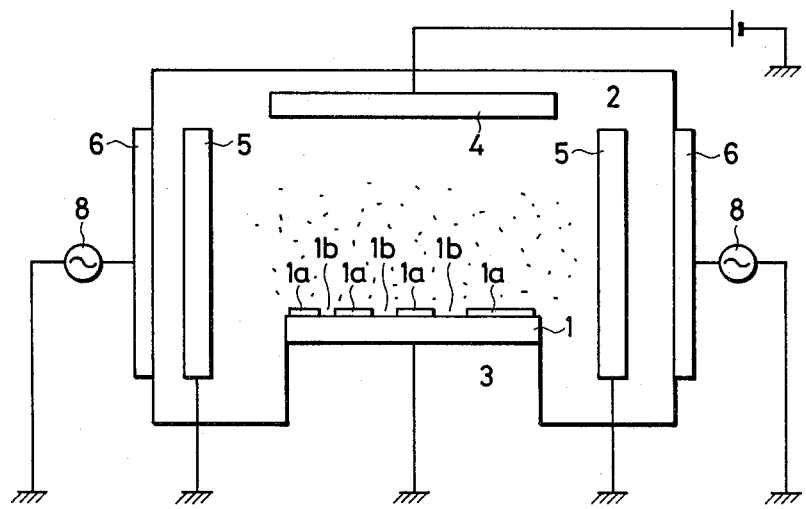
FIG. 2 is a schematic sectional view of an apparatus according to a second embodiment thereof.

FIG. 2 is a schematic illustration of a second embodiment of an apparatus for producing the semiconductor device. In order to charge the monocrystalline silicon substrate 1, the substrate 1 is grounded and an electrode 4 connected to a DC power source is arranged above the substrate 1. In order to form an impurity conductive layer within the monocrystalline silicon substrate 1 using an impurity deposited and adhered to the substrate 1, the support body 3 is heated whereby the impurity deposited and adhered to the substrate 1 is subjected to heat treatment. The selection of the temperature of the semiconductor substrate 1 and time, that is, the temperature of the support body 3 and the heating time enables the diffusion of a desired impurity conductive layer.

The semiconductor device produced using the apparatus shown in FIG. 2 is the same as that using the apparatus of FIG. 1.

Although high-frequency discharge is used to produce a plasma in above embodiments, other systems such as an electron shower may be used. If the atmospheric gas used to produce the plasma contains a corresponding impurity, a gas which facilitates discharge such as nitrogen, argon or hydrogen may be used as a carrier gas.

According to the present invention as described above, a semiconductor substrate having a surface which is at least partially exposed is arranged within a gaseous plasma atmosphere containing an impurity, and a potential drop or rise is applied to the semiconductor substrate, whereby an impurity layer is formed on exposed portions of the surface of the substrate, and then is diffused therein. Since defects of conductivity are not produced within the semiconductor substrate including the impurity layer, the invention has the effect that a subsequent heat treatment is not required for defect restoration. Accordingly, diffusion at a low temperature is possible, junctions at small depth can be easily formed, and the fineness of the device becomes greater.

What is claimed is:

1. A method for producing a conductive layer of a semiconductor device, comprising; exposing at least a portion of the surface of a semiconductor substrate, introducing a gas atmosphere including an impurity about said substrate and converting said atmosphere to a plasma state, producing a change in the potential of the semiconductor substrate by irradiating said semiconductor in a beam or shower of electrons, and forming an impurity layer on said exposed surface of the semiconductor substrate, by electrostatically attracting said impurity in the plasma state to said exposed surface.

2. A method for producing a conductive layer according to claim 1, including diffusing said impurity layer into the semiconductor substrate by means of a heat treatment.

3. A method for producing a conductive layer according to claim 2, wherein said heat treatment is performed by irradiating selected portions of said impurity layer with an energy beam.

4. A method for producing a conductive layer according to claim 3, wherein said irradiation proceeds simultaneously with the electrostatic attraction of said impurity to said exposed portions of the surface of the semiconductor substrate.

5. A method for producing a conductive layer according to claims 1, 2, 3 or 4, wherein said impurity includes at least one element selected from the group consisting of phosphorus, arsenic, boron and antimony.

6. A method for producing a conductive layer according to claim 3, wherein said irradiation proceeds after the attraction of said impurity to said exposed portions of the surface of the semiconductor substrate.

7. A method for producing a conductive layer according to claim 1, wherein said gas atmosphere containing said impurity in the plasma state includes a carrier gas for facilitating discharge.

8. A method for producing a conductive layer according to claim 1, wherein said change in potential is produced on the semiconductor substrate by means of self potential formation.

9. A method for producing a conductive layer of a semiconductor device, comprising; exposing at least a portion of the surface of a semiconductor substrate, introducing a gas atmosphere including an impurity about said substrate and converting said atmosphere to a plasma state, producing a change in the potential of the semiconductor substrate by subjecting the same to irradiation in an electron beam or shower, and forming an impurity layer on the exposed surface of the semiconductor substrate by electrostatically attracting said impurity in the plasma state to said exposed surface due to said change in potential thereof, and subsequently diffusing said impurity layer into the semiconductor substrate by means of a heat treatment performed by irradiating selected portions of said impurity layer with an energy beam.

* * * * *